United States Patent [19]

Takasaki et al.

[11] Patent Number: 5,004,906
[45] Date of Patent: Apr. 2, 1991

[54] LOGARITHMIC AMPLIFIER, AND IMAGE READ-OUT APPARATUS USING THE SAME

[75] Inventors: Yoshimi Takasaki; Kazuo Horikawa, both of Kanagawa, Japan

[73] Assignee: Fuji Photo Film Co., Ltd., Kanagawa, Japan

[21] Appl. No.: 466,837

[22] Filed: Jan. 18, 1990

[30] Foreign Application Priority Data

Jan. 20, 1989 [JP] Japan ................... 1-11386

[51] Int. Cl.⁵ ............................................ H01J 40/14
[52] U.S. Cl. ............... 250/214 A; 250/214 L.327.2; 330/51
[58] Field of Search ........ 250/214 A, 214 L, 327.2 E, 250/327.2 F; 307/311; 328/145; 330/51, 75, 110

[56] References Cited

U.S. PATENT DOCUMENTS

| | | | |
|---|---|---|---|
| 4,258,264 | 3/1981 | Kotera et al. | 250/484 |
| 4,276,473 | 6/1981 | Kato et al. | 250/327.1 |
| 4,315,318 | 2/1982 | Kato et al. | 364/515 |
| 4,387,428 | 6/1983 | Ishida et al. | 364/414 |
| 4,603,303 | 7/1986 | Matsuno et al. | 330/51 |
| 4,737,668 | 4/1988 | Bletz et al. | 328/145 |
| 4,857,733 | 8/1989 | Saotome et al. | 250/327.2 |
| 4,870,277 | 9/1989 | Saotome et al. | 250/327.2 |
| 4,885,467 | 12/1989 | Horikawk | 250/327.2 |
| 4,891,603 | 1/1990 | Oda | 330/110 |
| 4,931,642 | 6/1990 | Kosoi et al. | 250/327.2 |

FOREIGN PATENT DOCUMENTS

56-11395 2/1981 Japan .
61-5193 2/1986 Japan .

Primary Examiner—David C. Nelms
Assistant Examiner—Stephone B. Allen
Attorney, Agent, or Firm—Sughrue, Mion, Zinn, Macpeak & Seas

[57] ABSTRACT

A logarithmic amplifier comprises an amplifier provided with a feedback circuit, a logarithmic conversion device in the feedback circuit, an oscillation preventing circuit which is provided with a capacitor connected in parallel with the logarithmic conversion device, and a control circuit. The control circuit controls the oscillation preventing circuit in accordance with the current fed into the logarithmic amplifier, so that the amount of certain components in the output from the amplifier, which components are fed back to an input terminal of the amplifier through the oscillation preventing circuit, decreases as the current fed into the logarithmic amplifier becomes smaller. An image read-out apparatus comprises a photoelectric detector which detects light from a recording medium, which light is emitted by the recording medium when it is scanned, and the logarithmic amplifier into which the output current generated by the photoelectric detector is fed. An image having good sharpness is thereby obtained.

19 Claims, 6 Drawing Sheets

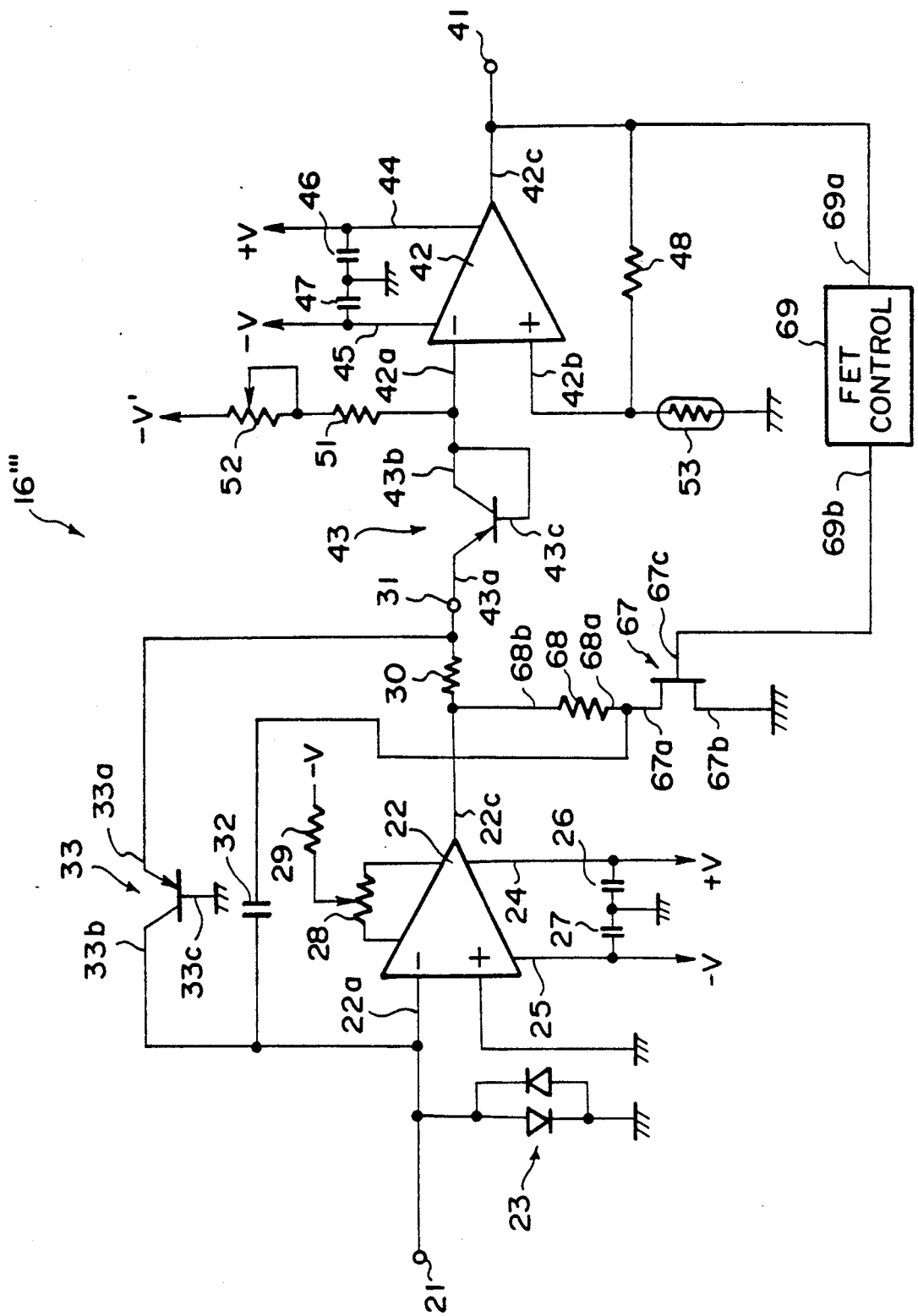

LOGARITHMIC AMPLIFIER, AND IMAGE READ-OUT APPARATUS USING THE SAME

BACKGROUND OF THE INVENTION

1. Field of the Invention

This invention relates to a logarithmic amplifier, and an image read-out apparatus provided with the logarithmic amplifier.

2. Description of the Prior Art

Techniques for reading out a recorded image in order to obtain an image signal, carrying out appropriate image processing on the image signal, and then reproducing a visible image by use of the processed image signal have heretofore been known in various fields. For example, as disclosed in Japanese Patent Publication No. 61(1986)-5193, an X-ray image is recorded on an X-ray film having a small gamma value chosen for the type of image processing to be carried out, the X-ray image is read out from the X-ray film and converted into an electric signal, and the electric signal (image signal) is processed and then used for reproducing the X-ray image as a visible image on a copy photograph or the like. In this manner, a visible image having good image quality with high contrast, high sharpness, high graininess, or the like can be reproduced.

Also, when certain kinds of phosphors are exposed to radiation such as X-rays, $\alpha$-rays, $\beta$-rays, $\gamma$-rays, cathode rays or ultraviolet rays, they store part of the energy of the radiation. Then, when the phosphor which has been exposed to the radiation is exposed to stimulating rays such as visible light, light is emitted by the phosphor in proportion to the amount of energy stored during its exposure to the radiation. A phosphor exhibiting such properties is referred to as a stimulable phosphor. As disclosed in U.S. Pat. Nos. 4,258,264, 4,276,473, 4,315,318, 4,387,428, and Japanese Unexamined Patent Publication No. 56(1981)-11395, it has been proposed to use stimulable phosphors in radiation image recording and reproducing systems. Specifically, a sheet provided with a layer of the stimulable phosphor (hereinafter referred to as a stimulable phosphor sheet) is first exposed to radiation which has passed through an object such as a human body in order to store a radiation image of the object thereon, and is then scanned with stimulating rays, such as a laser beam, which causes it to emit light in proportion to the amount of energy stored thereon during its exposure to the radiation. The light emitted by the stimulable phosphor sheet, upon stimulation thereof, is photoelectrically detected and converted into an electric image signal. The image signal is then used to reproduce the radiation image of the object as a visible image on a recording material such as photographic film, on a display device such as a cathode ray tube (CRT), or the like.

Radiation image recording and reproducing systems which use stimulable phosphor sheets are advantageous over conventional radiography using silver halide photographic materials in that images can be recorded even when the energy intensity of the radiation to which the stimulable phosphor sheet is exposed varies over a wide range. More specifically, since the amount of light emitted by the stimulable phosphor sheet upon stimulation thereof varies over a wide range and is proportional to the amount of energy stored during its exposure to the radiation, it is possible to obtain an image having a desirable density regardless of the energy intensity of the radiation to which the stimulable phosphor sheet was exposed. In order to obtain the desired image density, an appropriate read-out gain is set when the emitted light is being detected and converted into an electric signal to be used in the reproduction of a visible image on a recording material or a display device.

In the radiation image recording and reproducing systems which use X-ray film or stimulable phosphor sheets, an analog output signal generated by a photoelectric detector, such as a photomultiplier, is fed into a logarithmic amplifier which logarithmically converts the analog signal. The logarithmically converted analog signal is sampled and converted into a digital image signal, which is made up of a series of image signal components corresponding to respective picture elements of the image. The purpose of logarithmically converting the signal generated by the photoelectric detector, such as a photomultiplier, is to compress the current of the signal output by the photomultiplier, which current varies over a very wide range of approximately $-10^{-3}$A to approximately $-10^{-7}$A, to a range in which the maximum to minimum current has a ratio of approximately 4:1. Thereby the processing of the signal is facilitated.

Most logarithmic amplifiers are constituted of an operational amplifier and a transistor which is used for logarithmic conversion and which exhibits excellent exponential function characteristics. Specifically, the transistor is located in the feedback circuit of the operational amplifier.

In a logarithmic amplifier constituted of an operational amplifier with a transistor in its feedback circuit, when a large current is fed into the logarithmic amplifier, a problem often occurs in that the effective resistance across the transistor decreases, and the logarithmic amplifier becomes unstable and oscillates. In order to eliminate this problem, a capacitor (a feedback capacitor) is often connected in parallel with the transistor.

In cases where the logarithmic conversion transistor and the feedback capacitor are connected in parallel, the operation of the logarithmic amplifier is stabilized. However, in such cases, when a small current is fed into the logarithmic amplifier, problems occurs in that the effective resistance across the transistor increases, and the frequency range of the logarithmic amplifier is limited by the effective resistance across the transistor and the capacitance of the feedback capacitor.

FIG. 4 is a graph showing examples of the frequency response characteristics of a logarithmic amplifier provided with a feedback capacitor. In the graph, the horizontal axis represents frequency, and the vertical axis represents gain. Each curve on the graph corresponds to a specific value of current which is fed into the logarithmic amplifier. The ×, Δ, O, □, and ● marks respectively indicate a current of 0.1 μA, 1.0 μA, 10 μA, 100 μA, and 1 mA.

As shown in FIG. 4, when the current fed into the logarithmic amplifier is relatively small, the gain decreases rather sharply in the high frequency region.

In cases where the frequency response characteristics of the logarithmic amplifier are poor in the high frequency region, the problem described below occurs. Specifically, when the logarithmic amplifier is used in an image read-out apparatus wherein an image which has been recorded on X-ray film, a stimulable phosphor sheet, or the like is read out in order to obtain an image signal, the image reproduced from the thus obtained image signal exhibits low sharpness.

However, as described above, the signal which represents an image may occur over a range as wide as approximately 4 orders of ten (i.e. over a range of approximately $-10^{-3}A$ to approximately $-10^{-7}A$). Therefore, the current fed into the logarithmic amplifier cannot be limited to values falling within a narrow range. That is, a large current may be fed into the logarithmic amplifier, and therefore a feedback capacitor is necessary in order to stabilize the operation of the logarithmic amplifier.

SUMMARY OF THE INVENTION

The primary object of the present invention is to provide a logarithmic amplifier which exhibits quick response characteristics when a small current is fed thereto and which operates reliably even when a large current is fed thereto.

Another object of the present invention is to provide an image read-out apparatus wherein a logarithmic amplifier is used in order to prevent the sharpness of an image read out from a recording medium from deteriorating.

The present invention provides a logarithmic amplifier comprising an amplifier, which is provided with a feedback circuit and a logarithmic conversion device in said feedback circuit of said amplifier, wherein the improvement comprises the provision of:
(i) an oscillation preventing circuit which is provided with a capacitor connected in parallel with said logarithmic conversion device, and
(ii) a control circuit which controls said oscillation preventing circuit in accordance with the current fed into said logarithmic amplifier, so that the amount of certain components in the output from said amplifier, which components are fed back to the input terminal of said amplifier through said oscillation preventing circuit, decreases as the current fed into said logarithmic amplifier becomes smaller.

The term "current fed into the logarithmic amplifier" as used herein embraces the current flowing into the input terminal of the logarithmic amplifier, and the current flowing out of the input terminal. Also, in this specification, the current fed into the logarithmic amplifier is referred to as being "small" when the absolute value of the current is small. The current fed into the logarithmic amplifier is referred to as being "large" when the absolute value of the current is large.

The control circuit may be provided with one of various types of control means which substantially changes the capacitance of the capacitor connected in parallel with the logarithmic conversion device. For example, as the control means, a variable capacitor may be used as the capacitor, which is connected in parallel with the logarithmic conversion device, and the capacitance of the capacitor may be varied therewith. Alternatively, a plurality of capacitors having different capacitances may be located in parallel and selectively connected across the amplifier. As another alternative, a plurality of capacitors may be connected in series, and a short-circuit means for placing a short circuit across respective capacitors may be provided. As a further alternative, a variable resistor means may be connected in series with the capacitor, which is connected in parallel with the logarithmic conversion device, and the resistance across the resistor may be varied. As the variable resistor means, a transistor or an FET as well as a variable resistor may be connected in series with the capacitor and the voltage at the base of the transistor or the voltage at the gate of the FET may be varied to vary the substantial resistance between the emitter and the collector of the transistor or the substantial resistance between the source and the drain of the FET. As a still further alternative, a switch, such as an analog switch, may be connected in series with the capacitor, which is connected in parallel with the logarithmic conversion device. The switch may be switched on and off in order to change the amount of certain components in the output from the amplifier, which components are fed back to the input terminal of the amplifier through the oscillation preventing circuit. With the switch, the amount of the output fed back to the input can be switched between a predetermined amount and a null amount. As a final alternative, a variable resistor means may be connected between one end of said capacitor and the ground to control the effective operation of the feedback capacitor. As the variable resistor means, a transistor or an FET can be used in place of a variable resistor.

The present invention also provides an image read-out apparatus wherein a recording medium, on which an image has been recorded, is scanned with light, and light emitted from the recording medium during the scanning is detected in order to obtain information about the image, wherein the improvement comprises the provision of:
(i) a photoelectric detector which detects the light emitted from the recording medium during the scanning, and
(ii) a logarithmic amplifier into which an output current generated by said photoelectric detector is fed,
said logarithmic amplifier comprising:
(a) an amplifier, which is provided with a feedback circuit,
(b) a logarithmic conversion device located in said feedback circuit of said amplifier,
(c) an oscillation preventing circuit which is provided with a capacitor connected in parallel with said logarithmic conversion device, and
(d) a control circuit which controls said oscillation preventing circuit in accordance with the current fed into said logarithmic amplifier, so that the amount of certain components in the output from said amplifier, which components are fed back to an input terminal of said amplifier through said oscillation preventing circuit, decreases as the current fed into said logarithmic amplifier becomes smaller,
whereby the sharpness of the image represented by said information is prevented from deteriorating.

With the logarithmic amplifier in accordance with the present invention, the control circuit controls the oscillation preventing circuit in accordance with the current fed into the logarithmic amplifier, so that the amount of certain components in the output from the amplifier, which components are fed back to an input terminal of the amplifier through the oscillation preventing circuit, decreases as the current fed into the logarithmic amplifier becomes smaller. Therefore, in cases where a large current is fed into the logarithmic amplifier and there is the risk that the logarithmic amplifier will become unstable, the amount of high frequency components in the output from the amplifier, which components are fed back to the input terminal of the amplifier through the oscillation preventing circuit, can be increased. For this purpose, for example, the capacitance of the capacitor is increased. In cases where the current fed into the logarithmic amplifier is small and the operation of the logarithmic amplifier is stable, but there is the risk that the response of the logarithmic amplifier will become too slow, the amount of high frequency components in the output from the amplifier, which components are fed back to the input terminal of the amplifier through the oscillation preventing circuit, can be decreased. For this purpose, for example, the capacitance of the capacitor is decreased. Accordingly, the logarithmic amplifier can always operate reliably and exhibits quick response characteristics.

With the image read-out apparatus in accordance with the present invention, the signal detected from the recording medium on which an image has been recorded is logarithmically converted with the logarithmic amplifier in accordance with the present invention. Therefore, the signal generated by the photoelectric converter can be logarithmically converted without the high frequency components of the signal being lost. Accordingly, the sharpness of the image represented by the signal is prevented from deteriorating.

BRIEF DESCRIPTION OF THE DRAWINGS

FIG. 6 is a circuit diagram showing still another embodiment of the logarithmic amplifier in accordance with the present invention.

DESCRIPTION OF THE PREFERRED EMBODIMENTS

The present invention will hereinbelow be described in further detail with reference to the accompanying drawings.

Figure 3:
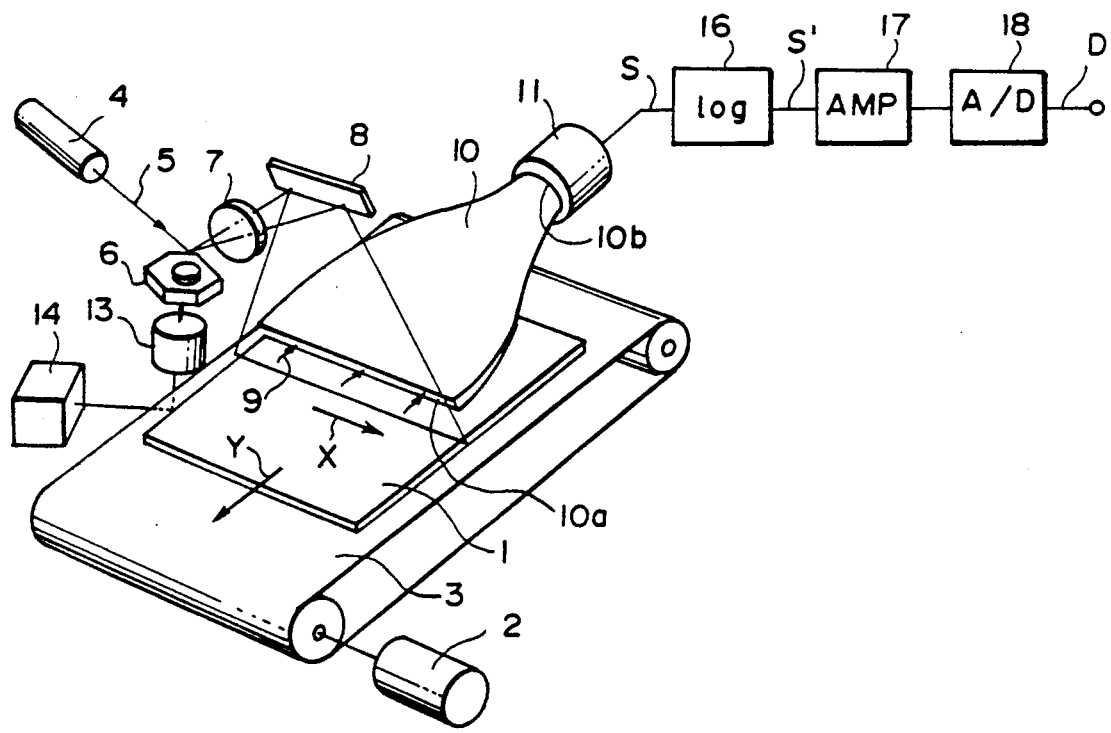
FIG. 3 is a perspective view showing an embodiment of the image read-out apparatus in accordance with the present invention.
Figure 4:
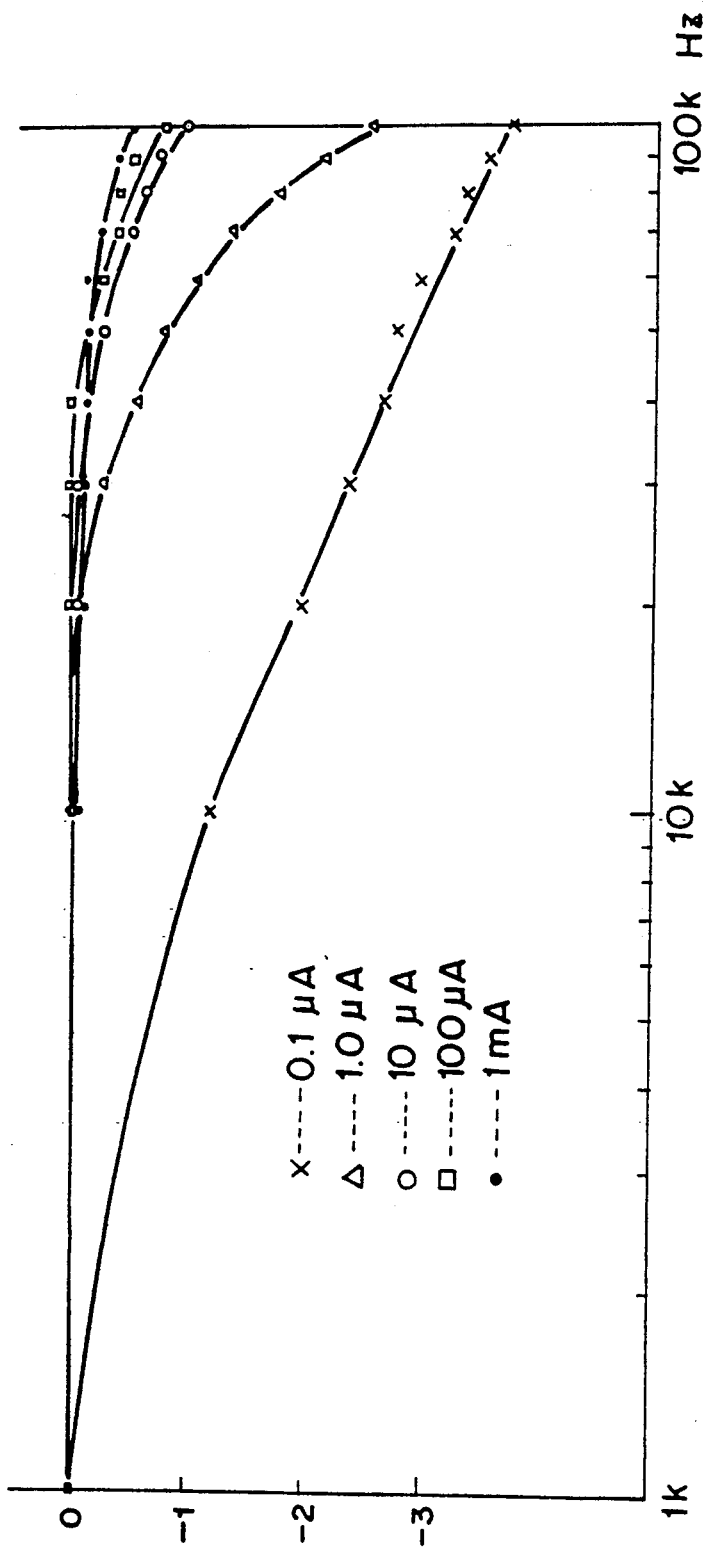
FIG. 4 is a graph showing examples of frequency response characteristics of a logarithmic amplifier provided with a feedback capacitor.

FIG. 3 is a perspective view showing an embodiment of the image read-out apparatus in accordance with the present invention. In this embodiment, a stimulable phosphor sheet is used as a recording medium.

With reference to FIG. 3, a stimulable phosphor sheet 1 on which a radiation image of an object has been stored is conveyed in a sub-scanning direction indicated by the arrow Y by a sheet conveyance means 3, which is constituted of an endless belt or the like and which is operated by a motor 2. A laser beam 5, which serves as stimulating rays, is produced by a laser beam source 4, and is reflected and deflected by a rotating polygon mirror 6 which is quickly rotated by a motor 13 in the direction indicated by the arrow. The laser beam 5 then passes through a converging lens 7 constituted of an fθ lens or the like. The direction of the optical path of the laser beam 5 is then changed by a mirror 8, and the laser beam 5 impinges upon the stimulable phosphor sheet 1 and scans it in a main scanning direction indicated by the arrow X, which direction is approximately normal to the sub-scanning direction indicated by the arrow Y. When the stimulable phosphor sheet 1 is exposed to the stimulating rays 5, the exposed portion of the stimulable phosphor sheet 1 emits light 9 in an amount proportional to the amount of energy stored thereon during its exposure to radiation. The emitted light 9 is guided by a light guide member 10 and photoelectrically detected by a photomultiplier 11 which serves as a photoelectric detector. The light guide member 10 is made from a light guiding material such as an acrylic plate and has a linear light input face 10a, positioned so that it extends along the main scanning line on the stimulable phosphor sheet 1, and a ring-shaped light output face 10b, positioned so that it is in close contact with a light receiving face of the photomultiplier 11. The emitted light 9, which has entered the light guide member 10 at its light input face 10a, is guided through repeated total reflection inside of the light guide member 10, emanates from the light output face 10b, and is received by the photomultiplier 11. In this manner, the amount of the emitted light 9, which amount represents the radiation image, is converted into an electric signal by the photomultiplier 11.

An analog output signal S generated by the photomultiplier 11 is logarithmically amplified by a logarithmic amplifier 16. An output signal S' generated by the logarithmic amplifier 16 is amplified by an amplifier 17 and thereafter converted by an A/D converter 18 into a digital image signal D.

The image signal D is fed into an image processing apparatus (not shown), which carries out appropriate image processing on the image signal D. Thereafter, the image signal D is fed into an image display device (not shown) and is used to reproduce a visible image.

Figure 1:
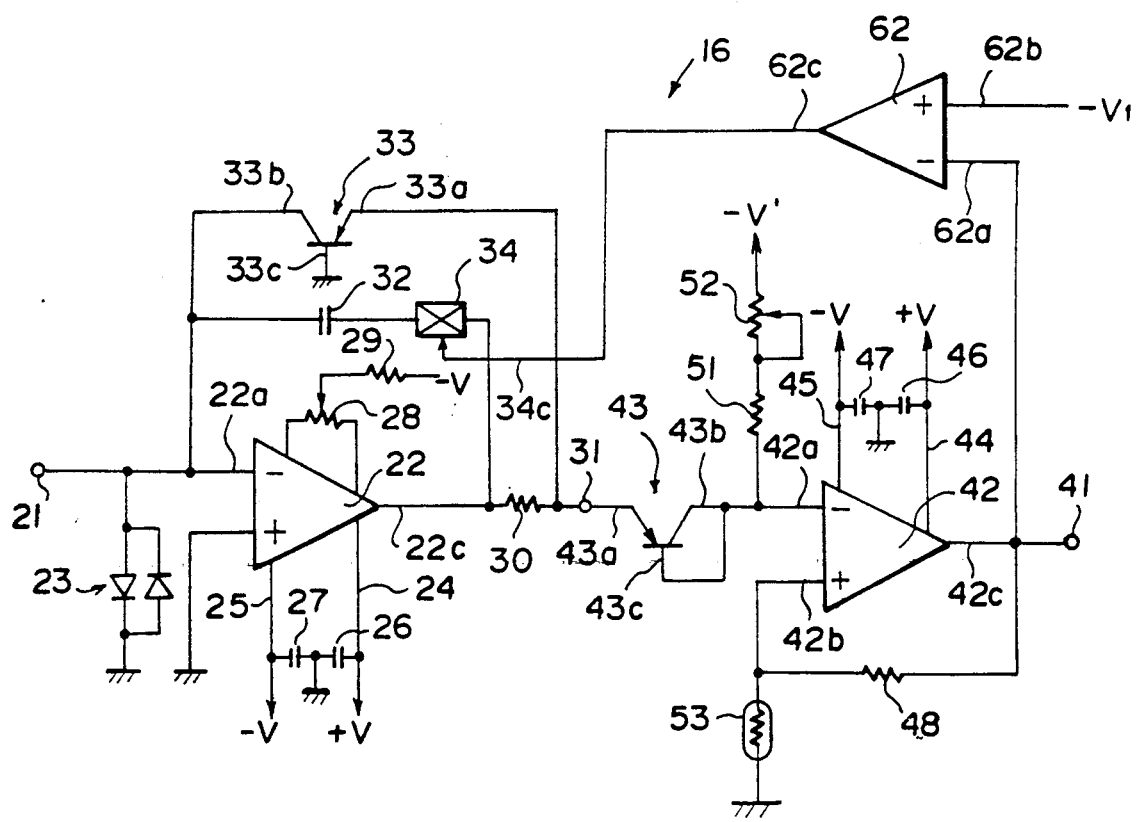
FIG. 1 is a circuit diagram showing an embodiment of the logarithmic amplifier in accordance with the present invention.

FIG. 1 is a circuit diagram showing the circuit configuration of an embodiment of the logarithmic amplifier 16 shown in FIG. 3.

With reference to FIG. 1, the first stage of the logarithmic amplifier 16 serves as a logarithmic conversion circuit and is constituted as described below. Specifically, an input terminal 21 is connected to the inverting terminal 22a of an operational amplifier 22, which operates quickly. The inverting terminal 22a is connected to ground through input protection diodes 23, 23, which are connected in parallel and which are oriented in opposite directions. The noninverting terminal of the operational amplifier 22 is grounded directly. Also, +V-volt d.c. and −V-volt d.c. are respectively fed into the operational amplifier 22 through power supply lines 24 and 25. The power supply lines 24 and 25 are respectively connected to ground through noise preventing capacitors 26 and 27. An offset adjusting circuit for the operational amplifier 22 is constituted of a variable resistor 28 and a resistor 29. The output terminal 22c of the operational amplifier 22 is connected to a terminal 31 via a protective resistor 30. Terminal 31 is an output terminal for the first stage of the logarithmic amplifier 16. An oscillation preventing capacitor 32 and the analog switch 34 are connected in series, and the combination of the oscillation preventing capacitor 32 and the analog switch 34 is connected across the operational amplifier 22, i.e. to the input terminal 21 and the output terminal 22c of the operational amplifier 22. A pnp transistor (feedback transistor) 33, which exhibits exponential function characteristics, is connected across the line between the input terminal 21 and the first-stage output terminal 31. The emitter 33a of the feedback transistor 33 is connected to the first-stage output terminal 31. The collector 33b of the feedback transistor 33 is connected to the input terminal 21, and the base 33c thereof is grounded.

When current is fed from the input terminal 21 of the logarithmic conversion circuit into the operational amplifier 22, an output voltage (a positive voltage) corresponding to the logarithmic value of the current appears at the first-stage output terminal 31.

Circuit elements of the second stage of the logarithmic amplifier 16 are located between the firststage output terminal 31 and a second-stage output terminal 41. The second stage of the logarithmic amplifier 16 serves as temperature compensation circuit.

The emitter 43a of a pnp transistor 43, which exhibits the same characteristics as the feedback transistor 33, is connected to the first-stage output terminal 31. The collector 43b and the base 43c of the transistor 43 are connected to the inverting terminal 42a of an operational amplifier 42. The transistor 43 affects the input impedance of the operational amplifier 42. If the transistor 43 exhibits the same characteristics as the feedback transistor 33, it and a temperature compensation device 53, which will be described later, will contribute to the temperature compensation of the logarithmic conversion circuit. The inverting terminal 42a is connected to a $-V'$-volt power source via a resistor 51 and a variable resistor 52. The resistor 51 and the variable resistor 52 are connected in series with each other and are used to make offset adjustments in the second-stage circuit.

+V-volt d.c. and −V-volt d.c. are respectively fed into the operational amplifier 42 through power supply lines 44 and 45. The power supply lines 44 and 45 are respectively connected to ground through capacitors 46 and 47. A resistor 48 is connected to the noninverting terminal 42b and the output terminal 42c of the operational amplifier 42. The noninverting terminal 42b is connected to ground through the temperature compensation device 53.

When the signal (having a positive voltage), after it has been logarithmically converted in the first stage, is fed into the second stage of the circuit, distortions in the signal caused by temperature variations are compensated for, and an appropriately amplified signal is fed out of the second-stage output terminal 41.

The inverting terminal 62a of a comparator 62 is connected to the second-stage output terminal 41. A predetermined reference voltage $-V1$ is fed into the noninverting terminal 62b of the comparator 62. The output terminal 62c of the comparator 62 is connected to a control input terminal 34c of the analog switch 62c.

The comparator 62 compares the signal fed out of the second stage of the circuit with the reference voltage $-V1$. The level of the signal fed out of the second stage of the circuit corresponds to the level of the current fed into the first stage of the circuit. (The term "level of a signal" as used in this embodiment means the level of the absolute value of the voltage. When the absolute value of voltage is large, the signal will hereinbelow be referred to as having a large value. When the absolute value of voltage is small, the signal will hereinbelow be referred to as having a small value.) Therefore, the comparator 62 determines whether the current fed into the first stage of the circuit is larger or smaller than a predetermined current.

When the value of the signal fed out of the second stage of the circuit is larger than the absolute value of the reference voltage $-V1$ (i.e. when the current fed into the first stage of the circuit is larger than the predetermined current), the comparator 62 turns on the analog switch 34, which connects the oscillation preventing capacitor 32 to the inverting terminal 22a and the output terminal 22c of the operational amplifier 22. When the value of the signal fed out of the second stage of the circuit is smaller than the absolute value of the reference voltage $-V1$ (i.e. when the current fed into the first stage of the circuit is smaller than the predetermined current), the comparator 62 turns off the analog switch 34, which disconnects the oscillation preventing capacitor 32 from the inverting terminal 22a and the output terminal 22c of the operational amplifier 22.

Specifically, when a large current is fed into the first stage of the circuit, the oscillation preventing capacitor 32 is electrically connected to the inverting terminal 22a and the output terminal 22c of the operational amplifier 22 in order to eliminate the problem that arises with the effective resistance across the feedback transistor 33 decreasing and the operation of the first stage of the circuit becoming unstable. When the current fed into the first stage of the circuit is small, the effective resistance across the feedback transistor 33 can be kept large and the operation of the first stage of the circuit will remain stable. The oscillation preventing capacitor 32 is disconnected from the inverting terminal 22a and the output terminal 22c of the operational amplifier 22 to achieve these ends and to improve the frequency response characteristics of the first stage of the circuit. Therefore, the sharpness of the image, which is represented by the digital image signal D shown in FIG. 3, can be prevented from deteriorating.

Figure 2:
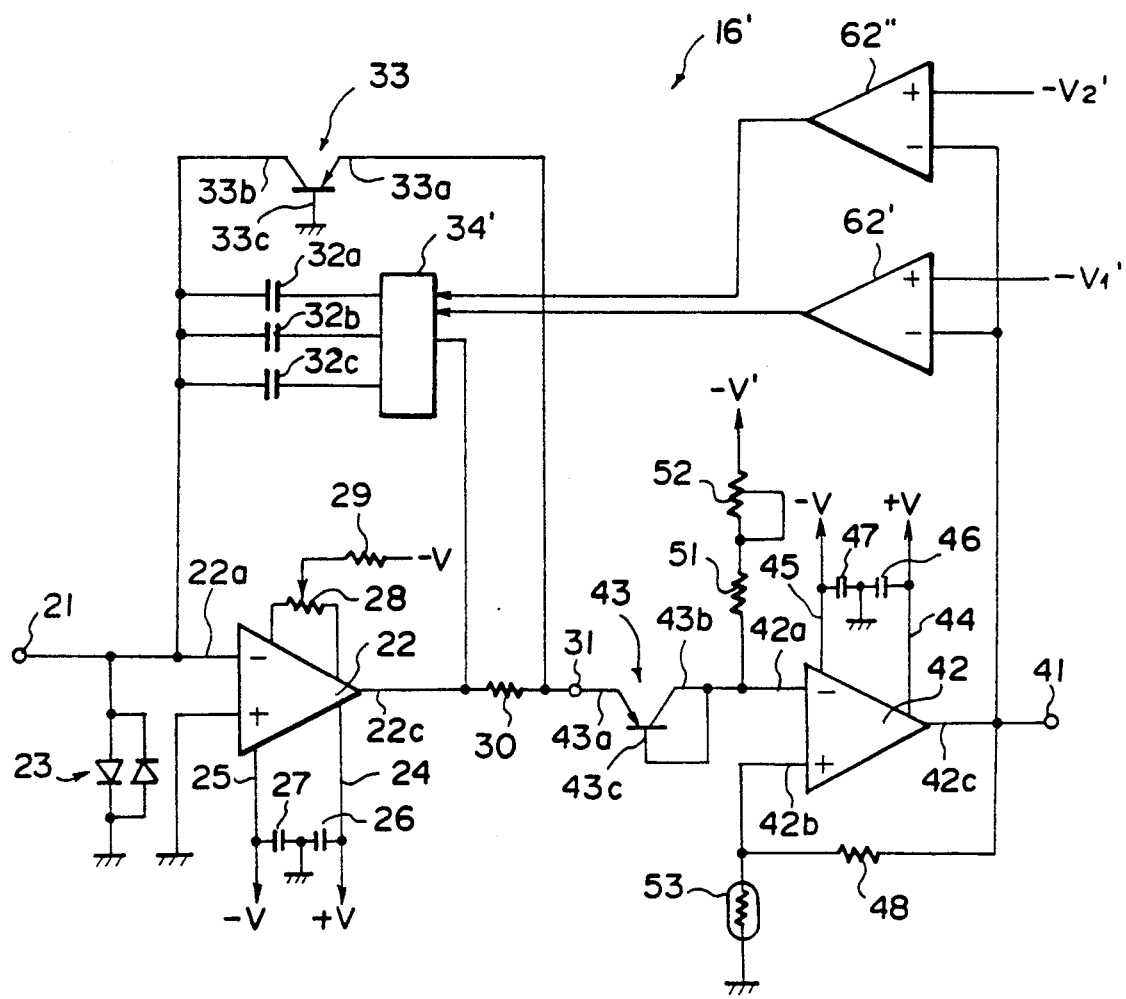
FIG. 2 is a circuit diagram showing another embodiment of the logarithmic amplifier in accordance with the present invention.

FIG. 2 shows another embodiment of the logarithmic amplifier in accordance with the present invention. In FIG. 2, similar elements are numbered with the same reference numerals with respect to FIG. 1.

With reference to FIG. 2, a logarithmic amplifier 16' comprises, by way of example, three capacitors 32a, 32b, and 32c in lieu of the oscillation preventing capacitor 32 shown in FIG. 1. The capacitors 32a, 32b, and 32c have different capacitances and are connected in parallel. Also, an analog multiplexer 34' is provided in lieu of the analog switch 34 shown in FIG. 1. Additionally, two comparators 62' and 62" are located in lieu of the single comparator 62 shown in FIG. 1, and two reference voltages $-V1'$ and $-V2'$ are used.

In the embodiment of FIG. 2, when the current fed to the input terminal 21 is large, the analog multiplexer 34' connects the capacitor which has the largest capacitance among the capacitors 32a, 32b, and 32c, to the inverting terminal 22a and the output terminal 22c of the operational amplifier 22. When the current fed to the input terminal 21 decreases, the analog multiplexer 34' disconnects the previously connected capacitor and connects the capacitor which has the second largest capacitance among the capacitors 32a, 32b, and 32c to the inverting terminal 22a and the output terminal 22c of the operational amplifier 22. When the current fed from the input terminal 21 decreases even further, the analog multiplexer 34' disconnects the previously connected capacitor and connects the capacitor which has the smallest capacitance among the capacitors 32a, 32b, and 32c, to the inverting terminal 22a and the output terminal 22c of the operational amplifier 22.

Because one of the capacitors 32a, 32b, and 32c is selectively connected to the inverting terminal 22a and the output terminal 22c of the operational amplifier 22, it is possible to eliminate the problem of the operation of the first stage of the circuit becoming unstable when the current fed into it is large. It is also possible to improve the frequency response characteristics of the first stage of the circuit when the current fed into it is small.

In the embodiment of FIG. 2, the capacitors 32a, 32b, and 32c are connected in parallel. Alternatively, a plurality of capacitors may be connected in series, and a short-circuit means for placing a short circuit across the respective capacitors may be provided.

In the above two embodiments of FIGS. 1 and 2, the analog switch or the analog multiplexer 34 is operated to connect the oscillation preventing capacitor 32; 32a, 32b, 32c between the inverting terminal 22a and the output terminal 22c of the operational amplifier 22, or to disconnect the oscillation preventing capacitor 32 therefrom. Alternatively, instead of the analog switch 34 being used, a resistor device whose resistance can be varied continuously or in a step-wise fashion may be used. The resistance of the resistor device may be increased as the current fed into the logarithmic amplifier becomes smaller.

Figure 5:
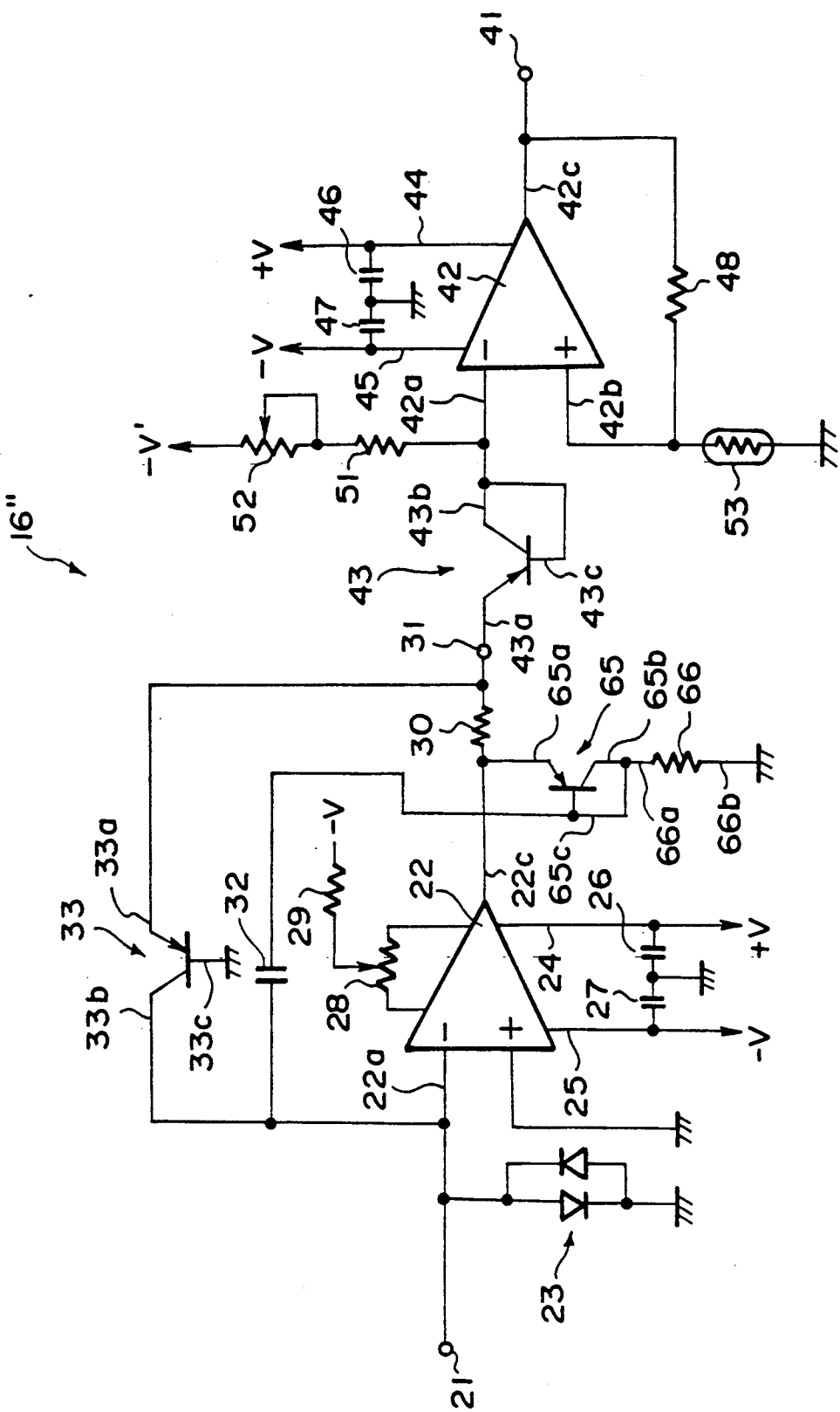
FIG. 5 is a circuit diagram showing another embodiment of the logarithmic amplifier in accordance with the present invention.

FIG. 5 is a circuit diagram showing another embodiment of the logarithmic amplifier according to the above variation. In FIG. 5, similar elements are numbered with the same reference numerals with respect to FIGS. 1 and 2 and the detailed description thereof will be omitted here.

The logarithmic amplifier 16" shown in this circuit diagram is provided with a pnp transistor 65 in place of the comparator 62 and the analog switch 34 as employed in the embodiment shown in FIG. 1. The emitter 65a and the collector 65b of the pnp transistor 65 are connected to the output terminal 22a of the operational amplifier 22 and one end 66a of a resistor 66, respectively. Further, the base 65c of the pnp transistor 65 is connected with the collector 65b thereof and further with an end of the capacitor 32.

When current is fed from the input terminal 21 of the logarithmic conversion circuit 16" into photomultiplier 11 (see FIG. 3), an output voltage (a positive voltage) corresponding to the logarithmic value of the current appears at the output terminal 22c of the operational amplifier 22 similarly to the aforesaid embodiments as shown in FIGS. 1 and 2. The output voltage thus appearing is input into the second-stage operational amplifier 42 and also into the transistor 65. At this stage, the higher is the voltage applied to the emitter 65a of the transistor 65, the lower becomes the resistance between the emitter and the collector, and the larger becomes the amount of feedback current through the capacitor 32 to more stabilize the operation of the circuit. On the other hand, as the voltage applied to the emitter 65a of the transistor 65 falls, the resistance between the emitter 65a and the collector 65b rises, whereby the amount of feedback current through the capacitor 32 is lowered to improve the frequency response characteristics of the circuit. This embodiment is advantageous as compared with the aforesaid embodiments in that the amount of feedback can be continuously controlled by the voltage appearing at the output terminal 22c of the operational amplifier 22.

FIG. 6 is a circuit diagram showing another embodiment of the logarithmic amplifier according to the above variation. In FIG. 6, similar elements are numbered with the same reference numerals with respect to FIGS. 1, 2 and 5 and the detailed description thereof will be omitted here.

The logarithmic amplifier 16''' shown in this circuit diagram is provided with an FET 67 and an FET controlling circuit 68 in place of the transistor 65 as employed in the embodiment shown in FIG. 5. The drain 67a of the FET 67 is connected to one end 68a of a resistor 68 and one end of the capacitor 32. Further, the other end 68b of the resistor 68 is connected with the output terminal 22c of the operational amplifier 22. The source 67b of the FET 67 is grounded and the gate 67c thereof is connected with the output terminal 69b of the FET controlling circuit 69. Further, the input terminal 69a of the FET controlling circuit 69 is connected with the second-stage output terminal 41. In this FET controlling circuit 69, the higher is the input current put into the input terminal 21 of the operational amplifier 16''', the larger becomes the resistance between the drain and the source of the FET 67. Therefore, similarly to the embodiment shown in FIG. 5, the amount of feedback current through the capacitor 32 increases to more stabilize the operation of the circuit as the input current increases. On the other hand, as the input current decreases, the amount of feedback current through the capacitor 32 is lowered to improve the frequency response characteristics of the circuit.

In the aforesaid embodiments of the image readout apparatus wherein the embodiments of the logarithmic amplifier in accordance with the present invention are employed, the stimulable phosphor sheet is used as the recording medium. The logarithmic amplifier and the image read-out apparatus in accordance with the present invention are applicable broadly when images recorded on various types of recording media are read out. For example, the logarithmic amplifier ahd the image read-out apparatus in accordance with the present invention are applicable also when a radiation image recorded on X-ray film is read out.

The application of the logarithmic amplifier in accordance with the present invention is not limited to image read-out apparatuses. The logarithmic amplifier in accordance with the present invention is applicable broadly to various types of apparatuses wherein a logarithmic amplifier which operates stably and exhibits good frequency response is required.

What is claimed is:

1. A logarithmic amplifier comprising an amplifier, which is provided with a feedback circuit and a logarithmic conversion device in said feedback circuit of said amplifier,
    wherein the improvement comprises the provision of:
    (i) an oscillation preventing circuit which is provided with a capacitor connected in parallel with said logarithmic conversion device, and
    (ii) a control circuit which controls said oscillation preventing circuit in accordance with the current fed into said logarithmic amplifier, so that the amount of certain components in the output from said amplifier, which components are fed back to the input terminal of said amplifier through said oscillation preventing circuit, decreases as the current fed into said logarithmic amplifier becomes smaller.

2. A logarithmic amplifier as defined in claim 1 wherein said capacitor is a variable capacitor, and said control circuit is provided with a control means which varies the capacitance of said variable capacitor.

3. A logarithmic amplifier as defined in claim 1 wherein said capacitor is composed of a plurality of capacitors, which have different capacitances and which are located in parallel, and said control circuit is provided with a control means which selectively connects one of said capacitors across said amplifier.

4. A logarithmic amplifier as defined in claim 1 wherein said capacitor is composed of a plurality of capacitors, which are connected in series, and said control circuit is provided with a control means which controls a short-circuit means for placing a short circuit across the respective capacitors.

5. A logarithmic amplifier as defined in claim 1 wherein said control circuit comprises a variable resistor means, which is connected in series with said capacitor, and a control means which varies the resistance across the resistor means.

6. A logarithmic amplifier as defined in claim 5 wherein said variable resistor means is a transistor, the resistance between the emitter and the collector thereof being varied by the control of the base voltage thereof.

7. A logarithmic amplifier as defined in claim 5 wherein said control circuit comprises a variable resistor means, which is connected between one end of said capacitor and the ground, and a control means which varies the resistance across the resistor means.

8. A logarithmic amplifier as defined in claim 7 wherein said variable resistor means is an FET, the resistance between the source and the drain thereof being varied by the control of the gate voltage thereof.

9. A logarithmic amplifier as defined in claim 1 wherein said control circuit comprises a switch, which is connected in series with said capacitor, and a control means which turns said switch on and off in order to change the amount of certain components in the output from said amplifier, which components are fed back to the input terminal of said amplifier through said oscillation preventing circuit, between a predetermined amount and the null amount.

10. An image read-out apparatus wherein a recording medium, on which an image has been recorded, is scanned with light, and light emitted from the recording medium during the scanning is detected in order to obtain information about the image, wherein the improvement comprises the provision of:
(i) a photoelectric detector which detects the light emitted from the recording medium during the scanning, and
(ii) a logarithmic amplifier into which an output current generated by said photoelectric detector is fed, said logarithmic amplifier comprising:
(a) an amplifier, which is provided with a feedback circuit,
(b) a logarithmic conversion device located in said feedback circuit of said amplifier,
(c) an oscillation preventing circuit which is provided with a capacitor connected in parallel with said logarithmic conversion device, and
(d) a control circuit which controls said oscillation preventing circuit in accordance with the current fed into said logarithmic amplifier, so that the amount of certain components in the output from said amplifier, which components are fed back to an input terminal of said amplifier through said oscillation preventing circuit, decreases as the current fed into said logarithmic amplifier becomes smaller, whereby the sharpness of the image represented by said information is prevented from deteriorating.

11. An image read-out apparatus as defined in claim 10 wherein said capacitor is a variable capacitor, and said control circuit is provided with a control means which varies the capacitance of said variable capacitor.

12. An image read-out apparatus as defined in claim 10 wherein said capacitor is composed of a plurality of capacitors, which have different capacitances and which are located in parallel, and said control circuit is provided with a control means which selectively connects one of said capacitors across said amplifier.

13. An image read-out apparatus as defined in claim 10 wherein said capacitor is composed of a plurality of capacitors, which are connected in series, and said control circuit is provided with a control means which controls a short-circuit means for placing a short circuit across the respective capacitors.

14. An image read-out apparatus as defined in claim 10 wherein said control circuit comprises a variable resistor, which is connected in series with said capacitor, and a control means which varies the resistance across the resistor.

15. An image read-out apparatus as defined in claim 14 wherein said variable resistor means is a transistor, the resistance between the emitter and the collector thereof being varied by the control of the base voltage thereof.

16. An image read-out apparatus as defined in claim 14 wherein said control circuit comprises a variable resistor means, which is connected between one end of said capacitor and the ground, and a control means which varies the resistance across the resistor means.

17. An image read-out apparatus as defined in claim 16 wherein said variable resistor means is an FET, the resistance between the source and the drain thereof being varied by the control of the gate voltage thereof.

18. An image read-out apparatus as defined in claim 10 wherein said control circuit comprises a switch, which is connected in series with said capacitor, and a control means which turns said switch on and off in order to change the amount of certain components in the output from said amplifier, which components are fed back to the input terminal of said amplifier through said oscillation preventing circuit, between a predetermined amount and to the null amount.

19. An image read-out apparatus as defined in claim 10 wherein said image is a radiation image, said recording medium is a stimulable phosphor sheet, and said stimulable phosphor sheet is scanned with stimulating rays which cause it to emit light in proportion to the amount of energy stored thereon during its exposure to radiation.

* * * * *